(12) United States Patent
Chang

(10) Patent No.: US 6,613,499 B2
(45) Date of Patent: Sep. 2, 2003

(54) DEVELOPMENT METHOD FOR MANUFACTURING SEMICONDUCTORS

(75) Inventor: Ching-Yu Chang, Tai-Chung Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/177,439

(22) Filed: Jun. 20, 2002

(65) Prior Publication Data

US 2002/0187437 A1 Dec. 12, 2002

Related U.S. Application Data

(62) Division of application No. 09/880,229, filed on Jun. 12, 2001, now abandoned.

(51) Int. Cl.[7] .............................. G03F 7/30; G03F 7/40; G03F 7/38
(52) U.S. Cl. ...................... 430/325; 430/311; 430/328; 430/331
(58) Field of Search ................................ 430/328, 331, 430/311, 325

(56) References Cited

U.S. PATENT DOCUMENTS

| | | | | |
|---|---|---|---|---|
| 5,213,950 A | * | 5/1993 | Dooley | 430/331 |
| 5,374,502 A | * | 12/1994 | Tanaka et al. | 430/311 |
| 5,731,132 A | * | 3/1998 | van Werden et al. | 430/331 |
| 5,821,036 A | * | 10/1998 | Ficner et al. | 430/331 |
| 6,107,009 A | * | 8/2000 | Tan | 430/331 |
| 6,403,284 B1 | * | 6/2002 | Yoshida | 430/331 |
| 6,451,510 B1 | * | 9/2002 | Messick et al. | 430/311 |

FOREIGN PATENT DOCUMENTS

JP 7-106226 * 4/1995

* cited by examiner

Primary Examiner—Richard L. Schilling
(74) Attorney, Agent, or Firm—J.C. Patents

(57) ABSTRACT

A development method in a micro-lithographic process uses a surfactant to overcome the hydrophobic nature on the surface of a photo-resist layer. A developer mixture formed by mixing a developer with a surfactant is used for developing the photo-resist layer. Instead of mixing with the developer, the surfactant may be used to cover the surface of the photo-resist layer before developing. Alternatively, the surfactant can also be applied to the photo-resist layer after it has been developed into a photo-resist pattern.

10 Claims, 5 Drawing Sheets

DEVELOPMENT METHOD FOR MANUFACTURING SEMICONDUCTORS

CROSS-REFERENCES TO RELATED APPLICATIONS

This is a division of U.S. application Ser. No. 09/880,229, filed Jun. 12, 2001 now abandoned.

FIELD OF THE INVENTION

The present invention generally relates to a micro-lithographic process in semiconductor manufacturing, and more specifically to a development method in the micro-lithographic process for transferring VLSI design patterns to a wafer.

BACKGROUND OF THE INVENTION

In most of the processing steps for manufacturing a semiconductor device structure, the micro-lithographic process has been used to transfer design patterns for various semiconductor layers and thin film layers. Defining areas for adding dopants also relies on the micro-lithographic process. Whether the device integration in the semiconductor industry can be moved towards a smaller line width depends on the progress of the micro-lithographic technique. Therefore, the micro-lithographic process plays a very important role in manufacturing multi-function and highly integrated semiconductor devices.

In the micro-lithographic process, essential materials include photo-mask, photo-resist, developer and cleaning solution. Photo-resists can be classified as positive and negative. The materials used in a positive photo-resist are novolak, sensitizer such as photoactive compound (PAC), additive and solvent. When a sensitizer is exposed to light, a nitrogen gas is generated and the sensitizer reacts with water to form carboxylic acid which can be resolved in an alkali solvent. Therefore, the exposed area in a photo-resist layer can be resolved in a developer. When the exposed area is removed by the developer, the design pattern is transferred to the photo-resist layer on the wafer.

A negative photo-resist contains a phenol based material. If a negative photo-resist is exposed to a light source, a nitrogen gas is generated to form an active mobile base that establishes a bridge structure to connect ring-typed resins. The active mobile base can not be resolved in a developer. Because of the swelling effect of a negative photo-resist, the resolution of transferred patterns is reduced. Therefore, positive photo-resists are usually used in the semiconductor industry in order to achieve higher resolution in the transferred patterns. In addition, a light source of a shorter wavelength has to be used to get sharper contrast and fine lines. For example, i-line with a wavelength of 365 nm is used in a 0.25 um design rule. Deep UV with a wavelength of 248 nm is used in a design rule between 0.15 um and 0.25 um.

With reference to FIGS. 1A–1E, the method of a conventional development process comprises the following steps:

1. Providing a wafer 102 seated on wafer holder 101 and coated with a layer of photo-resist 103 that have been exposed to a light source by means of a photo-mask;
2. Covering the photo-resist layer 103 with a developer 104;
3. Resolving the portion of the photo-resist layer 103 that has been exposed to the light by distributing the developer 104 through a dispenser 105;
4. Cleaning the surface of the wafer 102 with purified water 106 distributed from a water dispenser 107 to form a photo-resist pattern 109; and
5. Spinning the wafer 102 to remove water drops 108 above the wafer and drying the wafer.

The material of a photo-resist layer comprises primarily the structure of a polymer that is non-polar and hydrophobic. Because of the hydrophobic nature, the surface of the photo-resist layer is subjected to defect formation. When the surface of the wafer is patterned for contact holes, the exposed area is very small and the hydrophobic effect due to the large unexposed area becomes more severe.

FIGS. 2A–2D illustrate how a water drop 202 may cause a defect on the wafer surface. In addition to attaching a defect on the wafer 201 as a result of the hydrophobic effect, water marks are often formed on the surface when a wafer is cleaned. Because of the hydrophobic nature, the surface tension of the water drop 202 on the wafer surface is increased to condense the water into a small drop. When the water drop 202 is very small, the attraction force 204 between the wafer surface and the water drop 202 is significantly greater than the centrifugal force 203 from spinning the wafer. As shown in FIG. 2A, it is difficult to spin away the water drop 202. Impurities 206 may also be attached to the water drop 202 easily as illustrated in FIG. 2B. When the water is vaporized, the impurities 206 become water marks as shown in FIGS. 2C and 2D.

As can be seen from FIG. 2D, defects caused by water marks are usually distributed around the edge of the wafer. This is because the centrifugal force from spinning the wafer can not overcome the attraction force to remove the water drops. Although an approach to solving the problem is increasing the speed and time of spinning the wafer, the result has never been effective. In addition, this approach greatly increases the process time as well as the speed requirement of the spinning equipment.

In most of the steps of forming contact holes, the above mentioned defects due to the hydrophobic effect present a challenge to the device manufacturer. In a device using a 0.25 um design rule, the defect may cover a contact hole and results in a blind contact. As the design rule becomes 0.18 um or smaller, the defect problem becomes worse and the device yield is significantly impacted. It has been estimated that the problem may decrease the yield by more than 10%. Although it is not very effective, the semiconductor industry typically tries to solve the problem by increasing the spinning speed and time. In some cases, a TARC layer is also added to reduce the number of blind contacts caused by defects covering contact holes and to minimize the yield impact.

SUMMARY OF THE INVENTION

This invention has been made to overcome the above mentioned drawbacks of the conventional development process in manufacturing semiconductors. The primary object of the invention is to provide a development method that can reduce the number of defects introduced in the process to improve the yield of manufacturing a semiconductor device. Accordingly, a surfactant is used in the developing process to overcome the hydrophobic nature on the surface of a photo-resist layer.

Another object is to provide a development method that is effective in removing water drops and impurities on the surface of a wafer without increasing the processing time. It is also an object of the invention to provide a development method without adding more requirements to the spinning equipment used in the process.

According to this invention, a developer mixture is formed by mixing a developer with a surfactant. The developer mixture is distributed over the photo-resist layer that has a portion which has exposed to a light source with a photo-mask. In the developing step, the light-exposed photoresist is resolved by the developer mixture and a photo-resist pattern is formed. The wafer and the photo-resist pattern are then rinsed and cleaned by purified water. A spin drying process is used to spin the wafer for removing water drops on the wafer and drying the wafer. Because the surfactant is added to the developer, the surface tension of water drops is reduced. Defects or water marks do not remain on the wafer surface since water drops are easily removed after spinning the wafer.

According to this invention, the photo-resist layer is covered with the surfactant first and then the developer is distributed over the wafer instead of mixing the surfactant and the developer in advance. In a third embodiment, the surfactant is used to cover the photo-resist pattern only after the photo-resist layer has been developed, cleaned and rinsed to form the photo-resist pattern. The wafer is then spin and dried. In a fourth embodiment, another rinsing and cleaning step is added before the wafer is spin and dried.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 3:
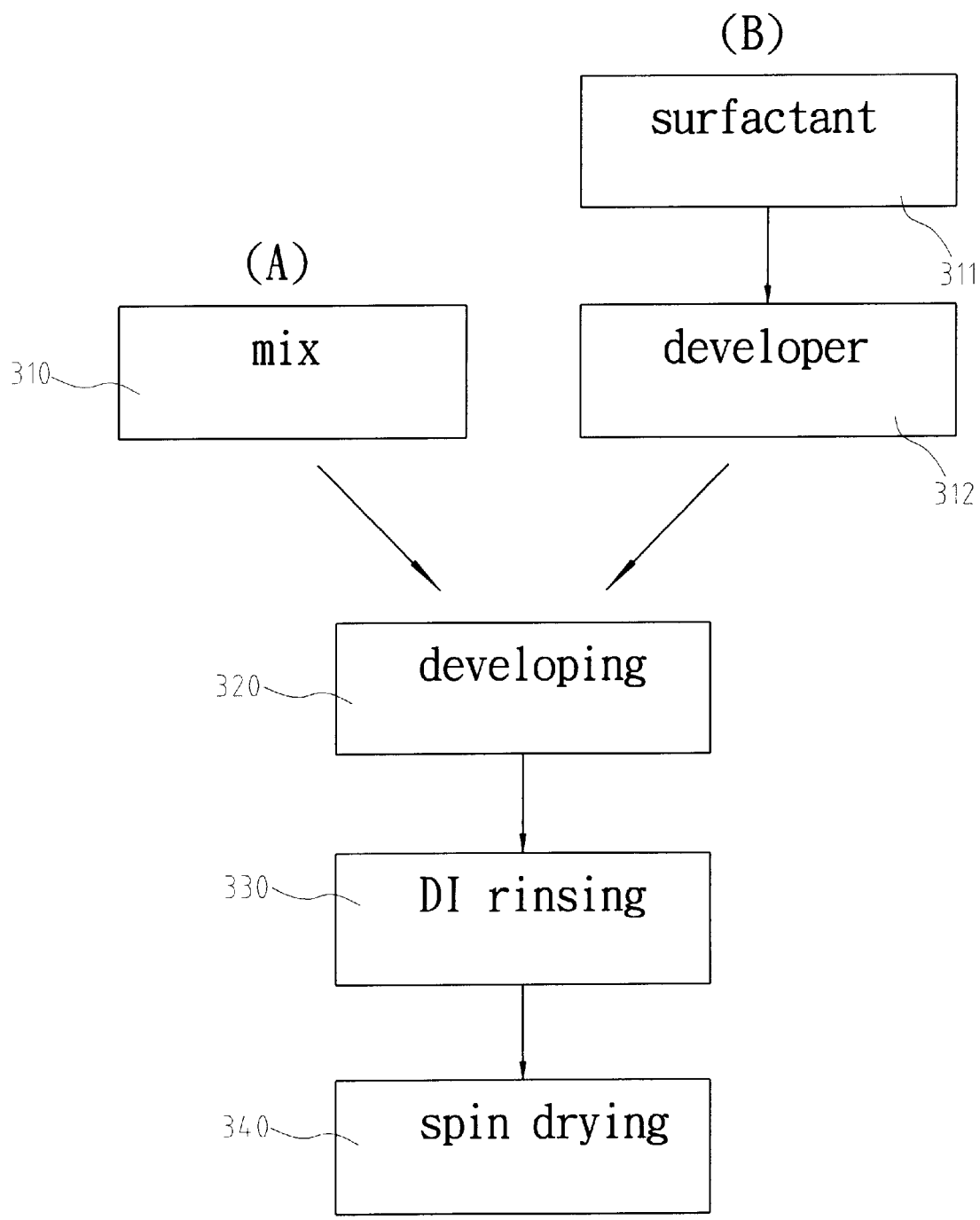
FIG. 3 shows the first and second embodiments of the development method according to this invention.

With reference to FIG. 3, in a first embodiment of the invention, a surfactant is mixed with a developer to form a developer mixture as shown in path (A). In step 310, the mixture is uniformly distributed above a photo-resist layer which has been coated on a wafer surface and exposed to a light source. The developer mixture can be deposited by spinning the wafer or any other method.

In the preferred embodiment, the developer is an alkali solvent with a PH value greater than 9. An example of the developer is TMAH (tetramethylammonium). The surfactant can be either anionic or non-ionic. Examples of anionic surfactants are $RfSO_3NH_4$ (ammonium perfluoroalkyl sulfonates), $RfCO_2NH_4$ (ammonium perfluoroalkyl carboxylates), $RfPO_4NH_4$ (ammonium perfluoroalkyl phosphates), or ammonium perfluoroalkyl phosphates with hydrocarbon. Examples of non-ionic surfactants are $RfSO_2N(C_2H_5)(CH_2CH_2O)_xH$ (fluorinated alkyl polyoxyethylene ethanol), $RfSO_2N(C_2H_5)(CH_2CH_2O)_xCH_3$ (fluorinated alkyl polyoxyethylene ethanol), or $RfCH_2CH_2O(CH_2CH_2O)_xH$.

According to this invention, the preferred surfactant has a structure of $RfXNH_4$. The preferred concentration of the surfactant is between 0.0001 and 0.1 in weight. In the $RfXNH_4$ structure, Rf can also be $CF_3(CF_2)_y$ with y being in the range between 3 and 5. The most preferred y value is 5. The X in the $RfXNH_4$ structure may be $CO_2$, $SO_3$ or $PO_4$. After the developer mixture is distributed, step 320 is a developing step in which the photo-resist layer exposed to light are resolved and removed by the developer mixture as a result of chemical reaction. A patterned photo-resist layer is thus formed.

In step 330, purified water is used to rinse the wafer surface. The developer mixture and the impurities created in the process of developing are removed by the purified water. It should be noted that the thickness of the photo-resist layer which has not been exposed to light may also be decreased by 10 Å to 100 Å during the developing step. The decrease of the thickness also introduces impurities that may be sources of defects. The period of rinsing depends on the process. The preferred period in this embodiment is 20 seconds. In step 340, the wafer is spin to remove water drops on the wafer surface and dry the wafer. The spinning speed and time also vary from process to process. The preferred time in the embodiment is 15 seconds.

In a second embodiment of this invention, the steps of developing 320, DI rinsing 330 and spin drying 340 are the same as those in the first embodiment. Instead of mixing a surfactant with a developer to form a developer mixture, a surfactant is first distributed on the photo-resist layer that has been exposed to a light source as shown in step 311 of path (B) of FIG. 3. The surfactant is used to improve the characteristics of the wafer surface. The developer is then distributed over the wafer that has been covered with surfactant in step 312. The chemicals and their concentration used in the second embodiment are the same as those used in the first embodiment.

Figure 4:
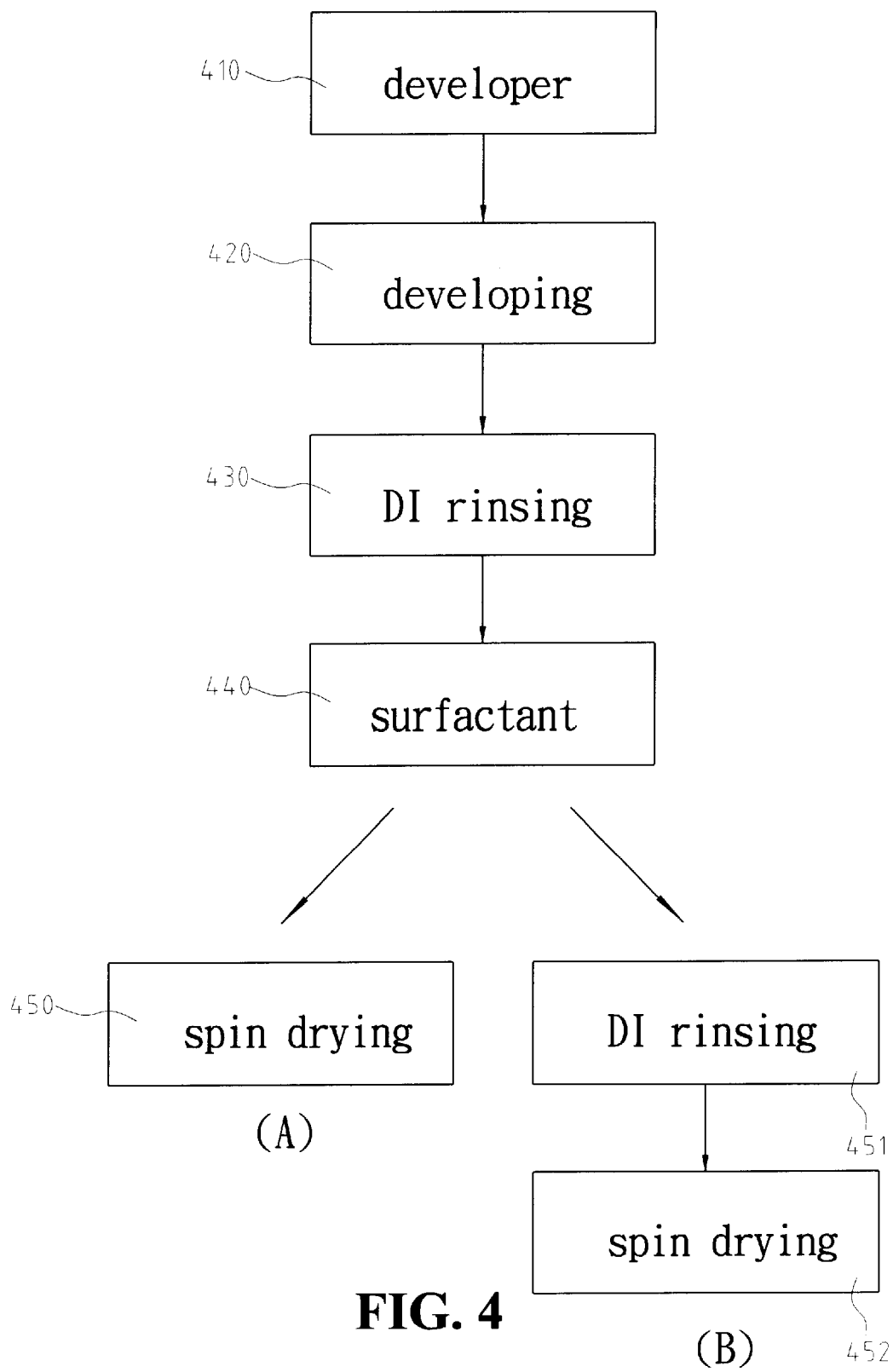
FIG. 4 shows the third and fourth embodiments of the development method according to this invention.

In a third embodiment of this invention, the surfactant is applied only after the developing and rinsing steps as illustrated in FIG. 4. In step 410, a developer is first distributed above the photo-resist layer that has been exposed to a light source. The photo-resist in the area that has been exposed to light is resolved and removed by the developer in the developing step 420. The wafer is rinsed by purified water in the DI rinsing step 430. The surfactant is then distributed above the wafer surface in step 440. The wafer is finally dried by spin drying in step 450 as shown in path (A) of FIG. 4.

In a fourth embodiment, the process steps from distributing the developer to applying surfactant are identical to those in the third embodiment. However, before drying the wafer by spin drying in step 452, another DI ringing step 451 is used to rinse and clean the wafer as shown in path (B) of FIG. 4.

The developer and surfactant used in the third and fourth embodiments are the same as those used in the first and second embodiments. The preferred materials of those chemicals and their preferred concentration as described above are also preferred in the third and fourth embodiments.

Figure 1A:
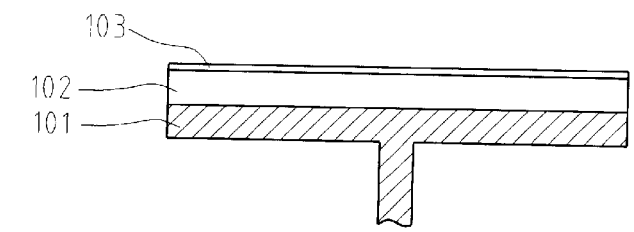
FIG. 1 shows the steps of the conventional development method in a micro photo-lithographic process of manufacturing a semiconductor device.
Figure 1B:
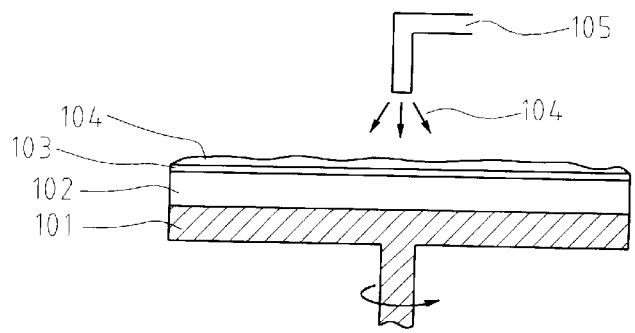
Figure 1C:
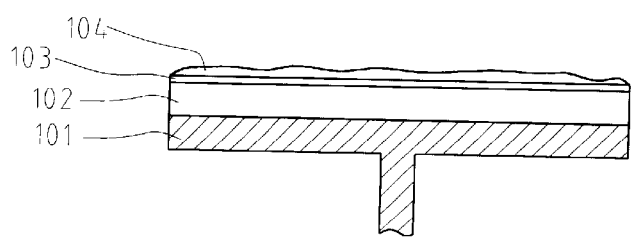
Figure 1D:
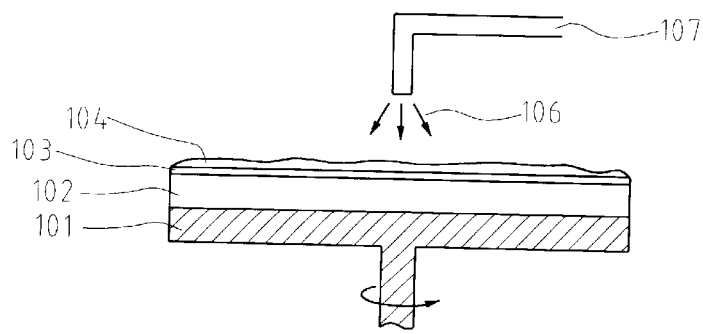
Figure 1E:
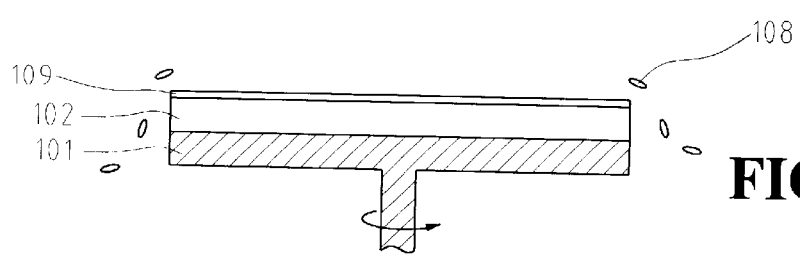
Figure 2A:
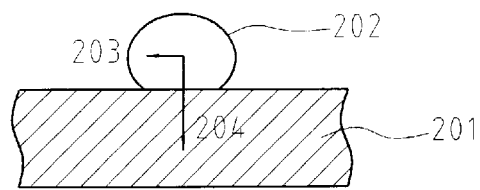
FIGS. 2A–2D illustrate how a water drop may cause defects and water marks on a wafer and the defect distribution on the wafer.
Figure 2B:
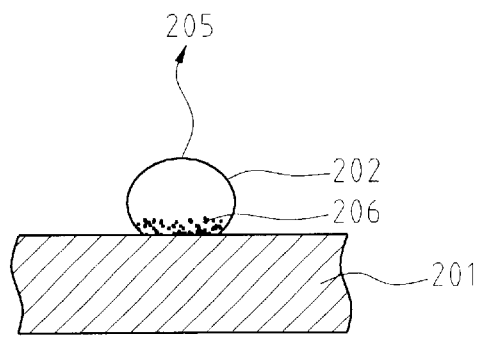
Figure 2C:
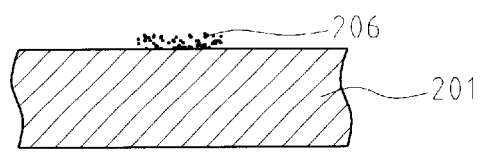
Figure 2D:
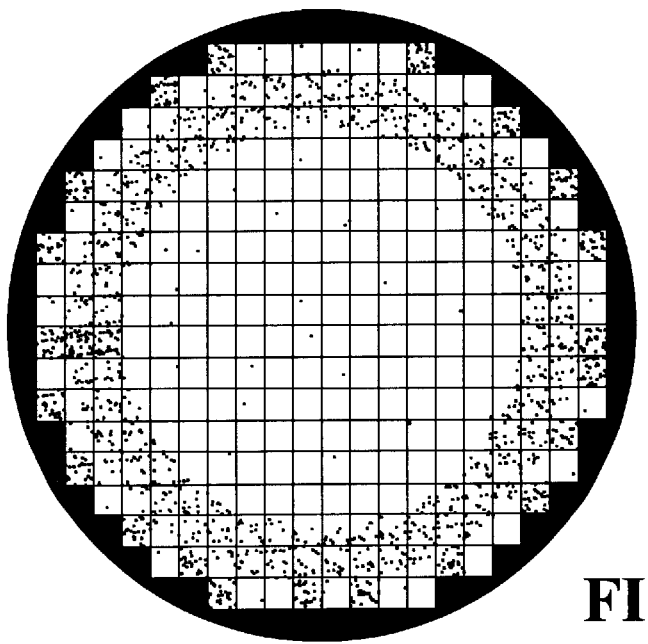
Figure 5:
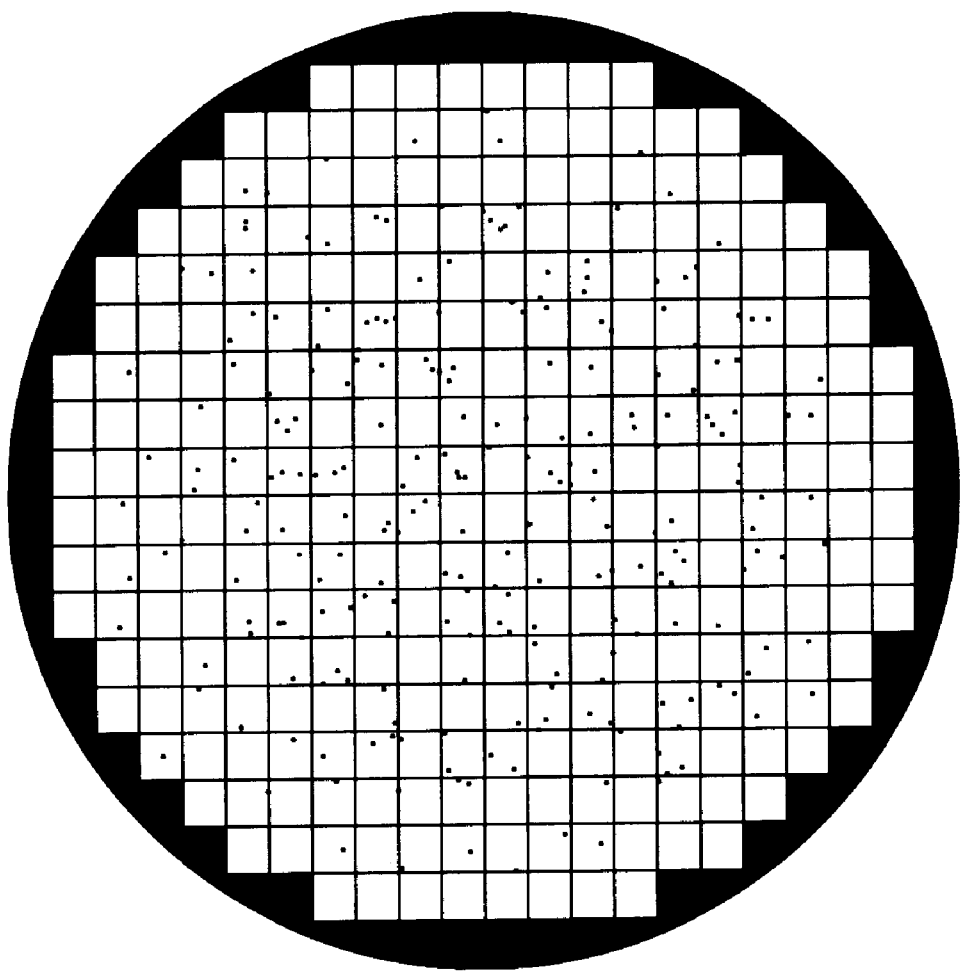
FIG. 5 shows the defect distribution of a wafer that is developed using the development method according to this invention.

FIG. 5 shows a defect distribution of a wafer after using the development method of this invention. As can be seen, the defects are no longer heavily distributed around the edge of the wafer and the number of defects are greatly reduced in comparison to FIG. 2D. The improvement does not rely on higher spinning speed or longer spinning period. Therefore, the invention presents an effective and low cost method of overcoming the defects that may cover contact holes during the micro photo-lithographic process of manufacturing a semiconductor device.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A development method for processing a photo-resist layer deposited on a wafer, said photo-resist layer having a portion exposed by a light source, said development method comprising the steps of:

distributing a developer over said photo-resist layer;

developing said photo-resist layer and removing the light exposed portion of said photo-resist layer to form a photo-resist pattern;

rinsing said photo-resist pattern and said wafer with purified water;

covering said photo-resist pattern with a surfactant, wherein said surfactant is an anionic surfactant selected from the following group consisting of $RfSO_3NH_4$ (ammonium perfluoroalkyl sulfonates), $RfCO_2NH_4$ (ammonium perfluoroalkyl carboxylates), $RfPO_4NH_4$ (ammonium perfluoroalkyl phosphates) and ammonium perfluoroalkyl phosphates with hydrocarbon; and drying said wafer by spinning said wafer to remove water drops on a surface of said wafer.

2. The development method as claimed in claim 1, said developer being an alkali solvent with a PH value greater than 9.

3. The development method as claimed in claim 2, said developer being tetramethylammonium (TMAH).

4. The development method as claimed in claim 1, said surfactant having a structure of $RfXNH_4$, with a concentration between 0.0001 to 0.1 parts in weight, wherein Rf represents perfluoroalkyl and X is selected from the group of $CO_2$, $SO_3$ and $PO_4$.

5. The development method as claimed in claim 4, wherein Rf in said $RfXNH_4$ structure is $CF_3(CF_2)_y$, with y being in a range between 3 and 5.

6. The development method as claimed in claim 1, further comprising a step of rinsing said wafer with purified water before the step of drying said wafer.

7. A development method for processing a photo-resist layer deposited on a wafer, said photo-resist layer having a portion exposed by a light source, said development method comprising the steps of:

distributing a developer over said photo-resist layer;

developing said photo-resist layer and removing the light exposed portion of said photo-resist layer to form a photo-resist pattern;

rinsing said photo-resist pattern and said wafer with purified water;

covering said photo-resist pattern with a surfactant, said surfactant being a surfactant selected from the following group consisting of $RfSO_2N(C_2H_5)(CH_2CH_2O)xH$ (fluorinated alkylpolyoxyethylene ethanol), $RfSO_2N(C_2H_5)(CH_2CH_2)xCH_3$ (fluorinated alkylpolyoxyethylene ethanol) and $RfCH_2CH_2O(CH_2CH_2O)xH$, wherein Rf represents either fluoroalkyl or fluorinated alkyl and x is larger than zero; and drying said wafer by spinning said wafer to remove water drops on a surface of said wafer.

8. The development method as claimed in claim 7, said developer being an alkali solvent with a PH value greater than 9.

9. The development method as claimed in claim 7, said developer being tetramethylammonium (TMAH).

10. The development method as claimed in claim 7, further comprising a step of rinsing said wafer with purified water before the step of drying said wafer.

\* \* \* \* \*